United States Patent
Bazarsky et al.

(10) Patent No.: US 10,379,739 B1
(45) Date of Patent: Aug. 13, 2019

(54) DATA STORAGE DEVICE READ THRESHOLD ADJUSTMENT ACCORDING TO ENVIRONMENTAL PARAMETERS

(71) Applicant: Western Digital Technologies, Inc., San Jose, CA (US)

(72) Inventors: Alexander Bazarsky, Tel Aviv (IL); Dudy Avraham, Even Yehuda (IL); Eran Sharon, Rishon Lezion (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/934,816

(22) Filed: Mar. 23, 2018

(51) Int. Cl.
| | |
|---|---|
| *G06F 3/06* | (2006.01) |
| *G11C 11/56* | (2006.01) |
| *G06F 11/10* | (2006.01) |
| *G11C 7/04* | (2006.01) |
| *G11C 16/04* | (2006.01) |

(52) U.S. Cl.
CPC .......... *G06F 3/0604* (2013.01); *G06F 3/0634* (2013.01); *G06F 3/0679* (2013.01); *G06F 11/1012* (2013.01); *G11C 7/04* (2013.01); *G11C 11/56* (2013.01); *G11C 16/04* (2013.01)

(58) Field of Classification Search
CPC .... G06F 3/0604; G06F 3/0634; G06F 3/0679; G11C 5/147; G11C 7/04; G11C 11/40626; G11C 2013/0095
See application file for complete search history.

(56) References Cited

U.S. PATENT DOCUMENTS

| | | | |
|---|---|---|---|
| 7,277,355 B2 | 10/2007 | Tanzawa | |
| 8,508,995 B2 | 8/2013 | Weingarten et al. | |
| 9,280,419 B2 | 3/2016 | Chunn et al. | |
| 9,330,790 B2 | 5/2016 | Kim et al. | |
| 2012/0102259 A1* | 4/2012 | Goss .................. | G11C 7/04 |
| | | | 711/103 |

(Continued)

OTHER PUBLICATIONS

U.S. Appl. No. 15/640,297, filed Jun. 30, 2017, Kirshenbaum et al.

(Continued)

*Primary Examiner* — Harry W Byrne
*Assistant Examiner* — Sultana Begum
(74) *Attorney, Agent, or Firm* — Knobbe, Martens, Olson & Bear LLP (57) ABSTRACT

Embodiments of systems and methods for management and/or optimization of non-volatile memory read thresholds using improved time and temperature tagging are described. In some embodiments, time and temperature tagging can be optimized based on time that it takes to perform read threshold calibration, the expected change in temperature, and/or the impact of this change on bit error rate. In some embodiments, a model of an environmental parameter can be determined and associated read thresholds can be pre-calculated. If the measured environmental parameter is within a threshold of the model for the environmental parameter, a pre-calculated read threshold value can be used instead of performing read threshold calibration. Advantageously, power consumption can be reduced and throughput for the memory device can be increased.

20 Claims, 4 Drawing Sheets

(56) References Cited

U.S. PATENT DOCUMENTS

| | | | |
|---|---|---|---|
| 2012/0287692 A1* | 11/2012 | Rotbard | G11C 11/56 365/45 |
| 2014/0157086 A1* | 6/2014 | Sharon | G06F 11/1012 714/773 |
| 2017/0255403 A1 | 9/2017 | Sharon et al. | |
| 2018/0336949 A1* | 11/2018 | Choi | G11C 16/04 |

OTHER PUBLICATIONS

U.S. Appl. No. 15/640,356, filed Jun. 30, 2017, Kirshenbaum et al.

* cited by examiner

DATA STORAGE DEVICE READ THRESHOLD ADJUSTMENT ACCORDING TO ENVIRONMENTAL PARAMETERS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

TECHNICAL FIELD

The present disclosure relates to calibration systems and methods for data storage devices, and more particularly, to calibration systems and methods that improve read and/or write threshold adjustment.

BACKGROUND

Non-volatile memory, such as flash memory, has been widely adopted for use in consumer products. Flash memory may be found in different forms, for example in the form of a portable memory card that can be carried between host devices or as a solid state disk (SSD) embedded in a host device. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by comparing the cell read out voltage to one or more read voltage thresholds, each of which corresponds to a different state. Read voltage thresholds need to be adjusted as memory cells wear over time out due to use. However existing approaches to adjusting read voltage thresholds are inefficient and inaccurate.

BRIEF DESCRIPTION OF THE DRAWINGS

The innovations described in the claims each have several aspects, no single one of which is solely responsible for its desirable attributes. Without limiting the scope of the claims, some prominent features of this disclosure will now be briefly described.

Systems and methods that embody the various features of the disclosure will now be described with reference to the following drawings, in which.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Some embodiments of systems and methods described herein improve the performance of a flash memory or non-volatile memory device by providing read threshold calibration settings that can be used to adjust read thresholds based on measurements of one or more environmental parameters. Some embodiments of the systems and methods described herein provide efficient and optimized read thresholds adjustments that allow for improved quality of service for the user and/or throughput of the non-volatile memory device. The read threshold calibration settings can include a model and/or pre-characterization of an environmental parameter, such as temperature. Based on the model, optimal read thresholds can be determined. If the measured environmental parameter is within a threshold of the model for the environmental parameter, a predetermined read threshold can be used instead of having to perform read threshold calibration. Reducing the amount of scheduled threshold calibrations can reduce read errors as well as overall power consumption and can improve efficiency. Although embodiments of the present disclosure refer to read thresholds, other operating parameters can be optimized. For example, other operating parameters can be retrieved based on a measurement of temperature and how the measurement is within a threshold of a model for the temperature.

Generally described, operating parameters (for example, read thresholds) establish parameters used to read to or write from a memory cell or group of memory cells (for example, data blocks or wordlines) within a non-volatile memory device. While it may be possible for a device to determine optimal operating parameters (for example, read thresholds) for each memory cell or group of cells within the device, such a calibration process (for example, read threshold calibration) may significantly increase the computing resources required at the device (for example, in terms of memory to store the operating parameters for each cell or group of cells, in terms of processing cycles required to retrieve and apply the correct operating parameters when writing to a cell or group of cells, etc.). To limit such increases, the non-volatile memory device can be configured to allow storage of a predetermined number of operating parameters (for example, read thresholds), and to retrieve the operating parameters that are optimal based on environmental parameters that following a predicted pattern and/or model.

For example, a device can be configured to store operating parameters (for example, read thresholds), and to use the operating parameters to read from or write to each memory cell or group of memory cells within a device. At various points within the operating life of a device, the device may determine whether a current set of operating parameters is appropriate for a given cell or group of cells (for example, whether use of the operating parameters results in an error rate for the cell or cell group of less than a threshold amount). Depending on usage, memory cells in a device may be impacted differently, and over time re-calibration of operating parameters may be needed. If the current set of operating parameters is not appropriate, the device may attempt to determine a new set of operating parameters for the cell or cell group, and to store that new set of operating parameters as one of the allowed number of sets. For example, a bit error rate may increase due to memory cells becoming worn out, and thus, new read thresholds may be desired.

Operating parameters can include any parameters used by a non-volatile memory device to write to or read from memory cells or memory cell groups, and which can vary between memory cells or cell groups. For example, operating parameters can include a set of read voltage thresholds for a block of memory cells (representing a logical grouping of memory cells), used to distinguish between various potential values stored by the block of memory cells. Examples of operating parameters can include voltage levels or increments used to write data to a data block or error correction mechanisms applied to the data block.

In some embodiments, read thresholds can be modeled and/or pre-calculated based on measurements of operating parameters. In some embodiments, write thresholds can be modeled and/or pre-calculated. For example, based on certain measurements of environmental parameters (e.g. temperature), write thresholds can be retrieved. In some embodiments, the write threshold can be retrieved without performing write threshold calibration. Write thresholds can be modified for certain write operations, such as re-writing data, using soft bit decoding as opposed to hard bit decoding, and/or the like.

One of the challenges introduced by process shrinking and 3D stacking in the course of solid state memory manufacturing is maintaining process uniformity. This can often lead to increased variability between memory dies, blocks and pages and across different endurance, retention, temperature and disturbance conditions. Operation under such diverse conditions requires using an adaptive system, especially in terms of tracking the optimal read thresholds in order to ensure that the read throughput and IOPS requirements are met and to ensure QoS (Quality of Service).

Read thresholds in non-volatile memory can indicate the voltages at which the device should read when discerning between adjacent states. Read thresholds that reflect the optimal read voltages result in information read with less BER (Bit Error Rate) and require less power to decode. Optimal read thresholds change over the life of the device due to different conditions such as P/E cycles, Data Retention (DR), Temperature Cross (Xtemp), and/or the like. Read threshold calibration can be used to track the current read thresholds and perform calibration operation.

In certain applications, such as Automotive or Internet of Things (IoT), strict requirements on endurance, reliability and power consumption may be imposed. Improving read threshold optimization may reduce the power consumption and increase the overall endurance of devices by reducing Write Amplification (WA) and Over Provisioning (OP). Some embodiments of the present disclosure improve the timing and effectivity of read threshold calibration operation by analyzing the environment in which the device typically resides.

Certain non-volatile memory management uses time and temperature tagging by classifying sets of memory blocks into the memory according to the time and temperature of when the groups of memory cells are read in. For example, a set of blocks that were written in the same temperature and/or around the same time can be classified as one group of memory cells. The group of memory cells can be labeled under a time and/or temperature tag.

In some non-volatile memory management systems, there may be a limited number of available time tags. In such non-volatile memory management systems, there can be a tradeoff between the effectivity of the time tags and the management aspect. For example, more time tags can result in a larger overhead and a large number of time tags to manage (for example, maintaining the time tag tables). Thus, there are benefits of reducing the number of time tags. Alternatively, having a low number of time tags can result in too large of memory cell groups. Furthermore, generating a new time tag can cause overhead to the memory device during the write procedure.

In some embodiments, temperature can be used to identify a pattern and the pattern can be associated with optimized read thresholds for the memory device. The thresholds are often affected by temperature. Thus, the temperature can be used as an indication of optimized read thresholds. For example, a memory device of a surveillance camera can be positioned outside. The temperature can have a cyclic behavior, where the temperature can be high during the day and low at night. Given this cyclic behavior, a memory device and/or an external device can establish read threshold calibration settings by pre-characterizing the temperature behavior in a model and/or can be used to identify the number of needed time tags in advance. Read thresholds and/or time tags can be generated in advance which can reduce overhead during the write procedure and/or perform the write procedure faster. The read thresholds can be predetermined and stored in a table. In some embodiments, the pre-characterization of the behavior of the environmental parameter can be based on a weather forecast report and/or the like. For example, the weather forecast report can indicate a predicted temperature for each hour of the next five days. In some embodiments, the pre-characterization of the behavior can be determined based on historical temperature data, seasonal data, time of the day, time of the month, time of the year, and/or the like.

In some embodiments, the memory device can receive and/or measure an environmental parameter. If an environmental parameter (for example, temperature) follows closely with the pre-characterized behavior of the environmental parameter, the memory device can optimize read threshold calibration by retrieving a read threshold that is pre-calculated and/or determined to be optimal for the environmental parameter. This can save the memory device from having to perform read threshold calibration. Furthermore, optimizing the read threshold calibration can allow for better quality of service as the read thresholds for the time and temperature tagging can be implemented without resorting to prohibitive overhead in calibration. Reducing the amount of scheduled read threshold calibrations can further reduce errors where periodic degradation in appearance arises as the time update is performed at predetermined schedules. Moreover, reducing the amount of scheduled read threshold calibrations can reduce overall power consumption.

In some embodiments, the time tag (TT) can include parameters that can be used for reading memory cells that belong to the time tag. These time tag parameters can be calculated after retractable calibration and stored in the time tag. The memory device can perform retractable calibration that can apply a voltage at certain thresholds and determine the logic of the memory cells.

While some embodiments are described herein with respect to specific groupings of memory cells (for example, data blocks or wordlines), embodiments may function with respect to any number of different groupings, or with respect to individual memory cells. For example, embodiments of the present disclosure may establish read threshold calibration settings at a per die level, or across multiple memory dies. Embodiments of the present disclosure may further establish offsets for specific blocks of memory (for example, based on the location of block), or for any other characteristic of a memory cell or collection of cells. Thus, the examples provided herein are intended to be illustrative in nature.

In some embodiments, the pre-characterization and/or model can be modified based on the amount of time passed since the write operation on the memory cell and/or on the group of memory cells. For example, performing a read operation shortly after writing to the memory cell may not require or may require minimal read threshold calibration, whereas a read operation several years after the write operation to the memory cell may require a more substantial read threshold calibration.

In some embodiments, a storage device includes a non-volatile memory including a plurality of non-volatile solid-state memory cells and a controller configured to determine a plurality of read thresholds associated with retrieving data stored in the plurality of non-volatile solid-state memory cells. The controller can be further configured to group at least some of the plurality of solid-state memory cells into a plurality of groups based on one or more values of an environmental parameter at one or more times of storing data in the at least some of the plurality of solid-state memory cells; prior to commencement of a future read threshold determination cycle, identify a first forecast of the environmental parameter for the future read threshold determination cycle for a first group of the plurality of groups of solid-state memory cells; in response to a determination that the first forecast of the environmental parameter satisfies a metric, determine at least one read threshold for the first group without performing read threshold calibration on the first group of the solid-state memory cells; in response to a determination that the first forecast of the environmental parameter does not satisfy the metric, determine the at least one read threshold for the first group based on performing read threshold calibration on the first group of the solid-state memory cells; and utilize the determined at least read threshold when reading data stored in at least one solid-state memory cell of the first group.

The storage device of any one or more preceding paragraphs can include one or more of the following features. The controller can be further configured to retrieve data stored in at least one solid-state memory cell of the first group based on the determined at least one read threshold. The determination of the at least one read threshold can include selecting the at least one read threshold from a plurality of precomputed read thresholds. The environmental parameter can include ambient temperature. The first forecast of the environmental parameter can include a forecast of at least one of an absolute temperature, a temperature difference, or frequency of temperature change.

The storage device of any one or more preceding paragraphs can include one or more of the following features. The controller can be further configured to prior to commencement of another future read threshold determination cycle, receive or determine a second forecast of the environmental parameter for the another future read threshold determination cycle for a second group of the plurality of groups of solid-state memory cells; determine at least one read threshold for the second group based on a determination whether the second forecast of the environmental parameter satisfies another metric; and utilize the determined at least one read threshold when reading data stored in at least one solid-state memory cell of the second group, wherein the at least one threshold for the second group is different from the at least one threshold for the first group. The controller can be further configured to determine the at least one read threshold for the first group and determine the at least one read threshold for the second group at different read threshold determination cycles. Read threshold determination cycles can be based on the one or more values of an environmental parameter at the one or more times of storing the data. The controller can be further configured to group the at least some of the plurality of the solid-state memory cells into the plurality of groups based on a time of storing the data into the at least some of the plurality of solid-state memory cells, wherein the read threshold determination cycles are further based on the time. The controller can be configured to identify the first forecast of the environmental parameter based on receiving the first forecast of the environmental parameter. The controller can be configured to identify the first forecast of the environmental parameter based on determining the first forecast of the environmental parameter.

In some embodiments, a storage device includes a non-volatile memory including a plurality of non-volatile solid-state memory cells and a controller configured to determine a plurality of read thresholds associated with retrieving data stored in the plurality of non-volatile solid-state memory cells. The controller can be further configured to group at least some of the plurality of solid-state memory cells into a plurality of groups based on one or more values of an environmental parameter at one or more times of storing data in the at least some of the plurality of solid-state memory cells; prior to commencement of a future read threshold determination cycle, identify a forecast of the environmental parameter for the future read threshold determination cycle for a group of the plurality of groups of solid-state memory cells; and selectively perform read threshold calibration on the solid-state memory cells of the group of solid-state memory cells based on the forecast of the environmental parameter to determine at least one read threshold for the group and utilize the determined at least read threshold when reading data stored in at least one solid-state memory cell of the group.

The storage device of any one or more preceding paragraphs can include one or more of the following features. The controller can be configured to selectively perform read threshold calibration by: in response to a determination that the forecast of the environmental parameter satisfies a metric, determine at least one read threshold for the group without performing read threshold calibration on the solid-state memory cells of the group; and in response to a determination that the forecast does not satisfy the metric, determine the at least one read threshold for the group based on performing read threshold calibration on the solid-state memory cells of the group. The controller can be configured to identify the forecast of the environmental parameter by receiving the forecast of the environmental parameter. The controller can be configured to identify the forecast of the environmental parameter by determining the forecast of the environmental parameter.

In some embodiments, a method of operating a storage device including a non-volatile memory with a plurality of non-volatile solid-state memory cells and a controller includes, by the controller, grouping at least some of the plurality of solid-state memory cells into a plurality of groups based on one or more values of an environmental parameter at one or more times of storing data in the at least some of the plurality of solid-state memory cells; prior to commencement of a future read threshold determination cycle, identifying a forecast of the environmental parameter for the future read threshold determination cycle for a group of the plurality of groups of solid-state memory cells; and selectively performing read threshold calibration on the solid-state memory cells of the group of solid-state memory cells based on the forecast of the environmental parameter to determine at least one read threshold for the group and utilize the determined at least read threshold when reading data stored in at least one solid-state memory cell of the group.

In some embodiments, the method of any one or more preceding paragraphs can include one or more of the following features. The forecast of the environmental parameter can include a forecast of a bit error rate and the method can further include determining the at least one read threshold for the group further based on the forecast bit error rate. The method can further include, by the controller, determining the forecast bit error rate based on a model for the environmental parameter. The model can include at least one of an ambient temperature or a range for ambient temperature during a predetermined time period. Selectively performing read threshold calibration can be based on a quality of service.

System Overview

Figure 1:
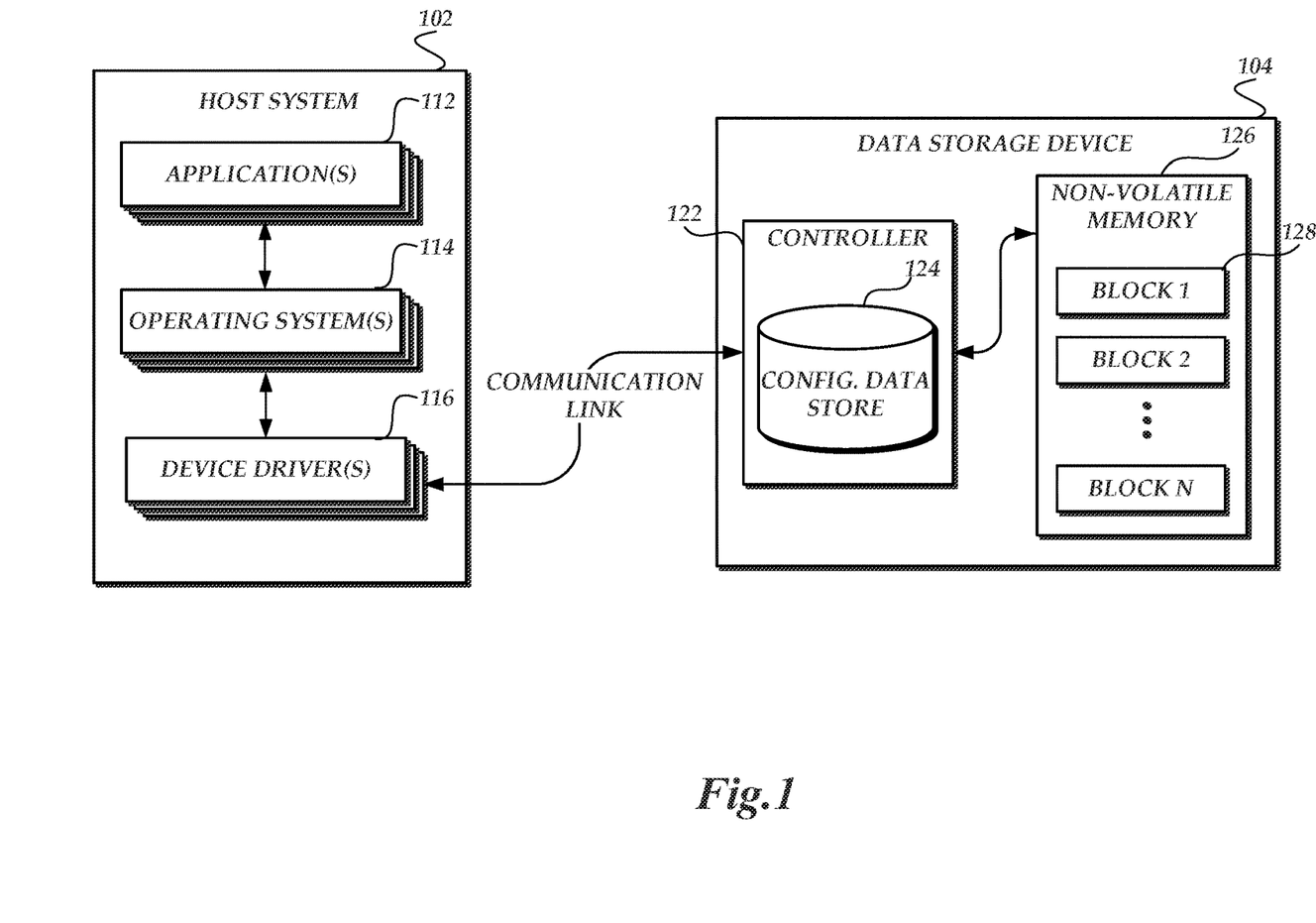
FIG. 1 is a block diagram illustrating a host communicating with a data storage device according to some embodiments of the present disclosure.

FIG. 1 illustrates a host system 102 and data storage device (or memory device) 104 in accordance with some embodiments of the present disclosure. As shown in FIG. 1, the host system 102, which can be any suitable computing device, generally includes one or more logical applications 112, operating systems 114, and device drivers 116. Such applications 112, operating systems 114, and device drivers 116 can represent logical software modules executed by underlying hardware components of the host system 102 (not shown within FIG. 1). Hardware components of the host system 102 may include, for example, one or more physical processors/micro-processors, hardware accelerators, system of chip (SoC), application-specific integrated circuits (ASICs), field programmable gate arrays (FPGAs), communication busses, volatile or non-volatile storage media, input devices, or output devices. Components of the host system 102 can enable logical applications 112, operating systems 114, and device drivers 116.

The applications 112 and operating systems 114 may provide various functionalities to users of the host system 110 which require or are assisted by storage of data within the data storage device 104. Accordingly, the host system may include one or more device drivers 116 configured to enable transmission of data storage commands (for example, read or write commands) to the data storage device 104. Such commands may be transmitted via a communication link between the host system 102 and the data storage device 104. In some embodiments, the communication link may include a mobile-storage interface, such as the Universal Flash Storage (UFS), Embedded MultiMediaCard (e.MMC), a micro SD card, and/or the like. In one embodiment, the communication link may include a storage bus, such as a serial ATA (SATA) storage bus or other storage bus utilizing the advanced host controller interface (AHCI) standard. In another embodiment, the communication link may include a system bus, such as a Peripheral Component Interconnect (PCI) or PCI Express bus. In still other embodiments, the communication link may include network communication links (for example, Ethernet links enabling communication via transmission control protocol (TCP)/internet protocol (IP) standards), a universal serial bus (USB) link, or any of a variety of known data storage communication links. In some embodiments, the communication link may include wireless communications, such as satellite communication, wireless networking, Wi-Fi, WiMAX, Bluetooth, ZigBee, a wireless router, and/or the like.

In the illustrated embodiment, the data storage device 104 includes the non-volatile memory 126 coupled to a controller 122. The controller 122 may enable the host system 102 to write to and read from the non-volatile memory 126, and perform other functionalities related to maintenance or operation of the data storage device 104, some of which are described below. The controller 122 may thus include a processor and memory configured to implement these functionalities. Data related to a configuration of the controller 122 may be stored in configuration data store 124, which may correspond illustratively to random access memory (RAM), read only memory (ROM), or a combination thereof. This data may include, for example, read threshold calibration settings that designate, for example, how the controller 122 operates to write data to or read data from the non-volatile memory 126. The number of read threshold calibration settings may be limited based on a configuration of the device 104. For example, the device 104 may be configured to store within the configuration data store 124 no more than 32 or 48 read threshold calibration settings, which can be applied to various logical groups within the non-volatile memory 126. In accordance with some embodiments of the present disclosure, the configuration data store 124 may further include offset information, denoting modifications to be made to an read threshold calibration setting when reading from or writing to specific memory cell groups (for example, wordlines) based on characteristics of those groups. In some embodiments, the configuration data store 124 includes read calibration data. For example, the read calibration data can include a calibration schedule. The schedule can indicate the frequency and/or the method of calibration for a block of memory, a one or more memory cells, and/or the like. The configuration data store 124 can include read threshold calibration settings, environmental parameters, such as the current temperature, temperature difference, and frequency of temperature change, and/or the like.

In some instances, the non-volatile memory 126 is a NAND flash memory. The NAND flash memory may include, for example, single-level cell (SLC) memory, multiple-level cell (MLC) memory, or a combination thereof. MLC memory may include 2-bits per cell memory, 3-bits per cell memory (known in some instances as "triple level cell," or TLC, memory), 4-bits per cell memory known in some instances as "quad level cell," or QLC, memory), etc. Cells within the non-volatile memory 126 can be organized into physical or logical groups. In the illustrative example of FIG. 1, the cells are organized into a plurality of blocks 128 (depicted in FIG. 1 as blocks 1 through n). One potential configuration of a block 128 is described below with respect to FIG. 2. In some embodiments, the memory 126 includes one or more of flash integrated circuits, Chalcogenide RAM (C-RAM), Phase Change Memory (PC-RAM, PRAM, or PCM), Programmable Metallization Cell RAM (PMC-RAM or PMCm), Ovonic Unified Memory (OUM), Resistive RAM (RRAM), Resistive Random Access Memory (ReRAM), NAND memory (for example, single-level cell (SLC) memory, multi-level cell (MLC) memory, or any combination thereof), NOR memory, EEPROM, Ferroelectric Memory (FeRAM), other discrete Non-Volatile Memory (NVM) chips, NOR flash memory, a solid state memory, and/or the like.

Non-volatile memory 126 can include measurable characteristics that vary among blocks 128 (for example, due to variances in manufacturing of the non-volatile memory 126). For example, because memory cells store information in the form of varying levels of voltage, each block 128 can be associated with one or more voltage thresholds that distinguish different information stored by the cell. For example, a stored voltage of between 0.375 and 1.125 volt may indicate a first value (for example, the bit string "110"), a stored voltage of between 1.125 and 1.875 volts may indicate a second value (for example, the bit string "100"), etc. To distinguish between stored values, a storage device 104 may establish one or more read thresholds for a block 128, such that if the stored voltage at the block 128 is below a first threshold, it is determined to store a first value, if the stored voltage at the block 128 is above the first threshold and below a second threshold, it is determined to store a second value, etc. The number of read thresholds established for a cell generally varies with the number of bits storable by the cell. For example, SLC memory generally establishes a single read threshold value, while 2-bit MLC establishes 3 read threshold values, 3-bit MLC establishes 7 read threshold values, 4-bit MLC establishes 15 read threshold values, etc. The controller 122 can be configured to determine optimal read threshold values according to a predetermined algorithm.

Other characteristics of blocks 128 can include, for example, times required for the controller 122 to successfully write to a block, a time required to erase a block 128, a number of failed bits detected at a block 128 (for example, instances in which the controller 122 attempted to write a bit value to a block 128 but after which the controller 122 failed to read that bit value from the block 128), a bit error rate (BER) of a block 128, or a number of programming loops required to set a block 128 to a desired value (for example, successive applications of voltage to the block 128 to cause the block 128 to maintain a desired voltage level). In accordance with general operation of NAND devices, these characteristics may vary across blocks 128 of non-volatile memory, across wordlines within blocks 128, or across other groupings of memory cells.

To address variances within groupings of memory cells, a device 104 may include different read threshold calibration settings, to be applied to different groupings. For example, the controller 122 may be configured to apply different read threshold calibration settings to different blocks 128. In one instance, a device 104 may include a set of "default" read threshold calibration setting to be applied to each block 128, and may re-evaluate the read threshold calibration settings during the life of the device 104. For example, a controller 122 may re-evaluate read threshold calibration settings of a block 128 when the block 128 has been completely written to, when reading from a block 128 results in a threshold number of errors, or when a bit error rate (BER) of the block 128 exceeds a threshold amount. Re-evaluation of read threshold calibration settings may include determining a set of optimal read threshold calibration settings for the block 128, and attempting to store those optimal read threshold calibration settings for the block 128 as a new read threshold calibration setting within the configuration data store 124.

Read Threshold Calibration

Figure 2:
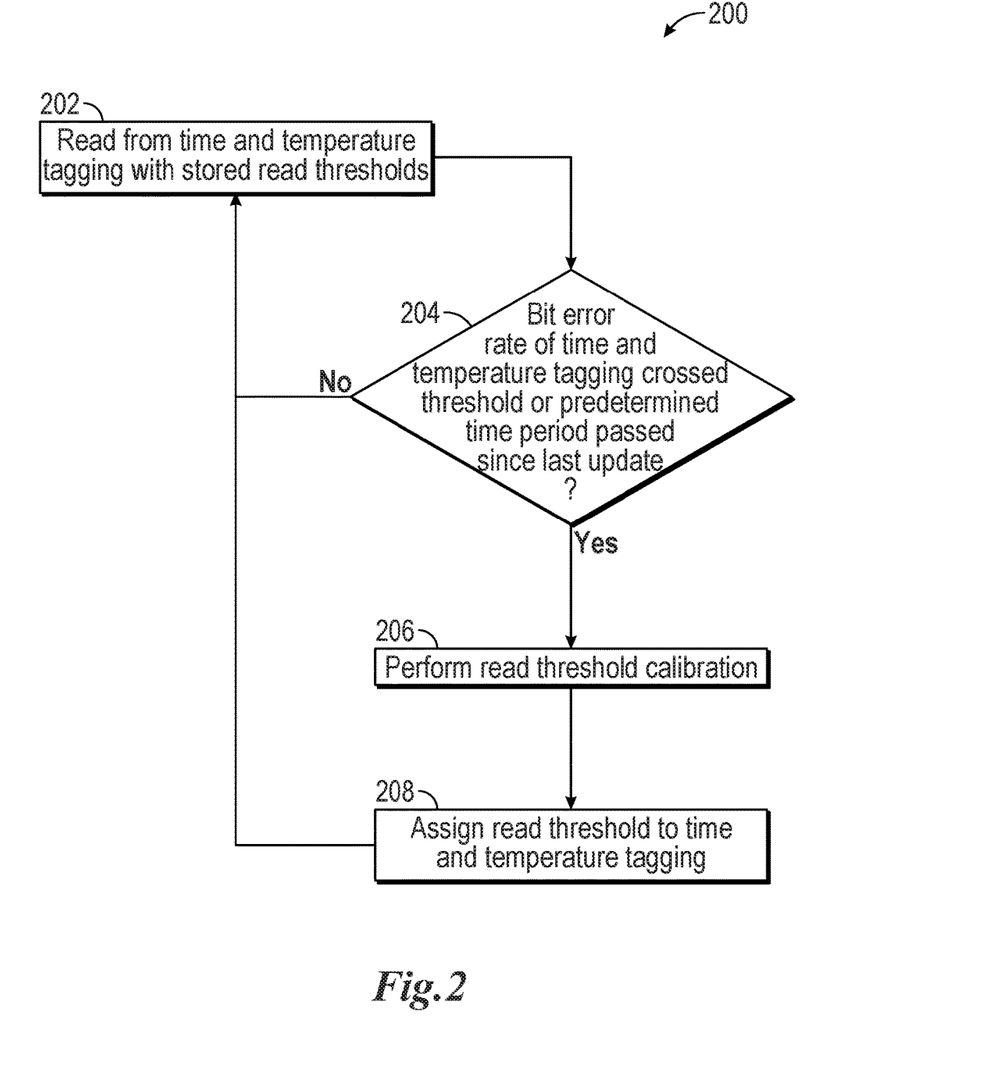
FIG. 2 is a block diagram illustrating a process for performing read threshold calibration according to some embodiments of the present disclosure.

In some embodiments, read thresholds can be triggered after a period of time or based on bit error rate. FIG. 2 is a block diagram illustrating a process 200 for performing read threshold calibration according to some embodiments of the present disclosure. The process 200 can be performed by a controller of the non-volatile memory device, such as the controller 122. At block 202, the process 200 can read time and temperature tags. The process 200 can also read stored read thresholds. The time and temperature tagging can include the group of memory cells that can have similar read thresholds applied to read and/or write operations. In some embodiments, the group of memory cells that share the time and temperature tagging are the group of memory cells that were written at substantially the same time and/or temperature.

At block 204, the process 200 can monitor the bit error rate of the time and temperature tag. When the bit error rate of the time and temperature tag exceeds a certain predetermined threshold, the memory device can determine that the number of errors are too high. Accordingly, the process 200 can determine that a read threshold calibration is to be performed.

Furthermore at block 204, after a certain time period passed since the last read threshold calibration, the process 200 can determine that a read threshold calibration should be performed.

If one of the conditions is met at 204, then at block 206, read threshold calibration (for example, retractable calibration) can be performed for the entire time and temperature tagging group of memory cells. At block 208, read thresholds can be assigned to the time tag for future read operations for that time tag. However, performing calibration in block 206 can result in higher power consumption and reduced throughput. Furthermore, if the update is time sensitive, the read threshold calibration can delay the processing of such an update. Furthermore, the read thresholds may not be dynamically adjustable and/or adaptable to known changes to time and/or temperature. Moreover, read threshold calibration occurs after a bit error rate exceeds an acceptable bit error rate. Thus, the current operation request may suffer from unacceptable errors, and the read threshold calibration performed for future read operations.

If none of the conditions are met at 204, the process 200 can continue to read from time and temperature tagging with the stored read thresholds.

Read Threshold Adjustment

Some embodiments of the present disclosure include analyzing temperature cycles of a memory device and optimizing the timing, frequency, and/or properties of future read calibration operations.

Figure 3:
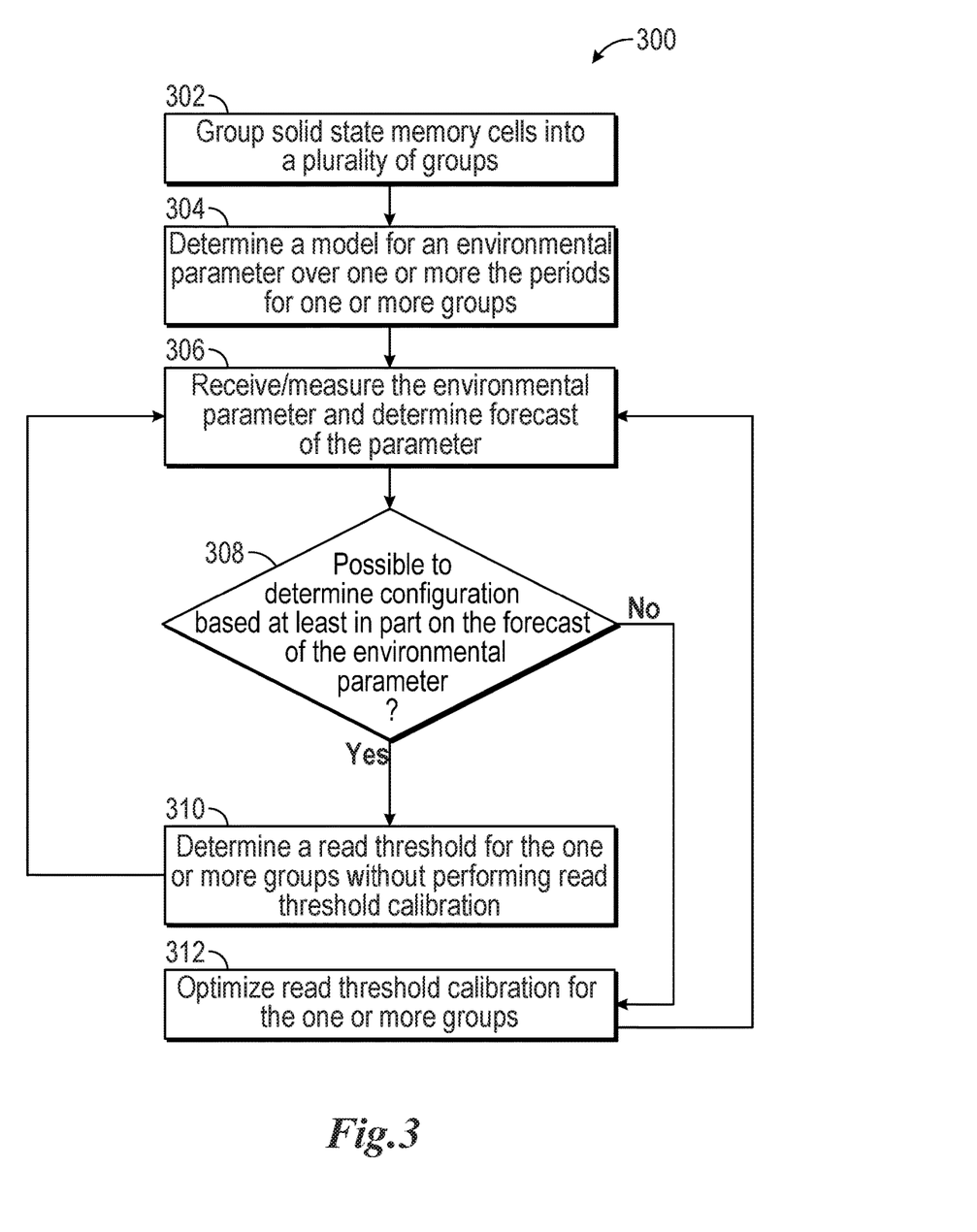
FIG. 3 is a block diagram illustrating a process for read threshold adjustment according to some embodiments of the present disclosure.

FIG. 3 is a block diagram illustrating a process 300 for read threshold adjustment according to some embodiments of the present disclosure. The process 300 can be performed by a controller of a non-volatile memory device, such as the controller 122. At block 302, solid state memory cells are grouped into a plurality of groups. The groups can be labeled with a time and temperature tagging. For example, the memory cells can be grouped based on the time and/or temperature of the write operation for the memory cell.

At block 304, a pre-characterization, a model, an estimate, a prediction, and/or the like is performed on one or more environmental parameters. In the example of FIG. 3, model of the change in the environmental parameter is determined over a certain period of time. For example, temperature at a certain time of the year for the memory device disposed in Irvine, Calif. can be modeled based on historical temperature data. During the day, the model can indicate that the temperature is estimated to be 70 degrees Fahrenheit and 50 degrees Fahrenheit in the evening. The model can indicate predicted temperatures throughout the day. If a model and/or profile of the temperature can be estimated, read thresholds can be precalculated. Based on the environmental parameter profile, the memory device can predict the read thresholds to be used for the expected temperatures.

In some embodiments, the model can be determined based on a weather report. The system can receive a weather report. For example, the memory device and/or a host connected to the memory device can receive a weather report for the day, the week, the month, and/or the like. Based on the predicted weather report, a model can be created for the environmental parameter (for example, temperature) and/or read threshold values predetermined. For example, a memory device in an automobile can have a different temperature profile depending on its location. Thus, the automobile can connect to a cloud server to obtain a weather report for the current location of the automobile. Then, the memory device can generate and/or adjust the model accordingly.

In some embodiments, the memory device can be installed in a car, a truck, an airplane, a naval vessel, and/or the like. Based on the type of system and/or vehicle the memory device is placed, the memory device can adjust and/or generate its model of the environmental parameter. In some embodiments, the memory device can receive commands, instructions, and/or the like that indicate how the memory device is to be used and/or is currently used. For example, the memory device can receive a customized or custom command from a cloud server indicating that the memory device is to be used in an automobile environment. Based on the command, the memory device can retrieve a profile for one or more environmental parameters for an automobile environment.

In some embodiments, a host system can communicate with the memory device. For example, the host system can inform the memory device of the future and/or current use and/or environment. For example, the host device can send to a memory controller of a memory device data indicative of the environment that the memory device can use to determine a model for the environmental parameter. In some embodiments, the memory device can derive the application context information (for example, the environment) by a model of measurements, for example, measurements of environmental parameters. Then, the measured environmental parameter can be used by other memory devices. For example, a model of environmental parameters can be generated by measurements of the environmental parameter by a memory device that is located in New York City. Then, the model can be uploaded to a host system. The host system can send the model and/or a derivative of the model to other memory devices located in New York City. In some embodiments, the model can be generated discretely and/or continuously.

In some embodiments, the memory device can adjust and/or generate the model of the environmental parameter based on characteristics disclosed herein. Adjusting and/or generating can include a plurality of models. For example, the memory device can have one set of models for a car and another set of models for an airplane. Within the set of models for the car, one model can be for tropical locations and another model for colder regions.

In some embodiments, the memory device can be connected to stationary or portable systems, such as smart home devices or systems. In some embodiments, the memory device can be connected to Internet of Things (IoT) devices, such as a video recorder, an audio recorder, apparel with electronics, sensor systems, security systems, and/or the like. Any of the systems to which the memory device can be connected may have one or more features of the host system 102 described herein. In some implementations, the memory device can receive information about the application for which it is being used (for example, automotive, IoT, or the like) via one or more custom commands communicated by the host system.

In some embodiments, the model of the environmental parameter can be determined based on a predicted amount of use for the device. If the memory is predicted to be used in a certain way (for example, overclocking performance), the model can estimate that the temperature will be higher for that duration of time. In some embodiments, the model of the environmental parameter can be based on the use of the memory, such as increased temperature if it is predicted that more of the memory will be accessed during that time. In some embodiments, the predicted amount of use of the memory can be estimated based on a workload and/or a predicted workload of the CPU.

In some embodiments, global positioning system (GPS) and/or inertial navigation unit (INU) data can be used to determine the model for the environmental parameter. In some embodiments, the device can be a mobile device. The device can include a GPS and/or receive geolocation data of the device. Based on the geolocation, an ambient temperature of the memory device can be estimated. The ambient temperature and/or predicted ambient temperature of the memory device can be used to determine a model for the environmental parameter. In some embodiments, the memory device can be in communication with a device to obtain a characteristic to determine the model for the environmental parameter, such as being in communication with a device that retrieves GPS and/or INU data.

In some embodiments, the INU data can be used to determine the model of the environmental parameter. The INU may correlate with a prediction of an environmental parameter. For example, a certain range of motion detected by an INU can indicate that certain predicted values for the environmental parameter are likely.

In some embodiments, the model can be based on the heat generated by the device that the memory is embedded onto. For example, the device can include a heat portfolio and/or profile that can be used to determine a model for the environmental parameter.

In some embodiments, altitude information can be used to determine a model for the environmental parameter. For example, a plane and/or a drone can provide altitude information. The heat model can be particular for a specific altitude. The model can indicate one heat profile for lower altitude and another heat profile for a higher altitude.

In some embodiments, the model of the environmental parameter can be based on a type of memory. Some memory devices can be embedded with better and/or more heat sinks. Certain memory devices can include different temperature performances as compared to other memory devices.

In some embodiments, the model can use historical and/or current measurements of an environmental parameter to determine a predicted value of the environmental parameter. In some embodiments, one or more factors above and described herein can be used to predict the environmental parameter. In some embodiments, the factors can be used to determine a particular value and/or range of values for the environmental parameter.

In some embodiments, the model can include a particular value and/or a range of acceptable values. For example, the model can include an absolute value for the environmental parameter, a threshold value (for example, +/− certain value of the environmental parameter), a % of the environmental parameter (for example, +/−5% of the environmental parameter), a standard deviation and/or variance of the environmental parameter, and/or the like.

In some embodiments, the model can include a particular read threshold value for a particular value for the environmental parameter. For example, the model can indicate that for a measured temperature of 70 degrees, that a first read threshold is stored, and for a temperature of 60 degrees, a second read threshold is stored.

In some embodiments, the measurement of the environmental parameter can include a mathematical function performed on the environmental parameter. For example, an average of the environmental parameter can be taken over a period of time. The standard deviation and/or the variance of the environmental parameter can be measured. A difference in environmental parameter over a period of time can be measured.

The model can be based on received predictions of the environmental parameter. In some embodiments, the process 300 can receive a weather report. For example, the memory device and/or a host connected to the memory device can receive a weather report for the day, the week, the month, and/or the like. Based on the predicted weather report, a model can be created for the temperature mode and/or read threshold values predetermined.

The model can include read temperature thresholds that are associated with the predicted environmental parameter for the model. For example, high temperatures of the model can be associated with a certain read threshold, and low temperatures of the model can be associated with a different read threshold. As such, the read thresholds can be predetermined, pre-calculated, pre-estimated, received beforehand, and/or the like. For example, during the day where high temperatures are expected, a first read threshold can be used, and at night where the temperature drops, a second read threshold can be used.

At block 306, the process 300 can receive and/or measure the environmental parameter. In some embodiments, the environmental parameter is received via a weather report. The environmental parameter can receive and/or estimate the environmental parameter that influences read thresholds of memory cells. Then, the model can be used to determine whether the environmental parameter (for example, the temperature) and/or the forecast of the environmental parameter of the memory device is substantially close to the predicted temperature. The environmental parameter can include absolute temperature, a temperature difference, a frequency of temperature change, and/or the like.

At block 306, the process 300 can determine a forecast of the environmental parameter. The process 300 can determine the forecast of the environmental parameter by assessing the model to identify the predicted environmental parameter for the model. In some embodiments, the forecast of the environmental parameter can be determined prior to commencement of a future read threshold determination cycle. The forecast of the environmental parameter can occur for the future read threshold determination cycle.

At block 308, the process 300 can include passing over part or all of the time tags and/or deciding if there is enough certainty to set the estimated read thresholds for that time tag for the segments of the next cycle. Each segment can represent a time period in which the read thresholds of a time tag should remain constant. For the time and temperature tags reaching a determination that there is enough certainty (for example, if the measured environmental parameter is within a threshold of the model), at block 310, the associated read threshold of the model can be retrieved. The associated read threshold can be predetermined, and thus, the updated read threshold can be used without having to perform read threshold calibration. At block 310, a read threshold for the one or more groups can be determined without performing read threshold calibration. For example, a table of pre-calibrated read threshold values can be used to determine the read threshold.

Block 308 can include optimization of a function that takes in the time that it takes to perform read threshold calibration, the expected change in temperature, and/or the impact of this change on bit error rate (BER). The function can determine and/or predict an effect on throughput and/or power consumption if a read threshold calibration is performed. Depending on some input threshold(s), the function and/or model can provide an indication that the temperature change is within a threshold of the model and/or the impact on the bit error rate is within a threshold. If the temperature change and/or the impact to the bit error rate is within a certain threshold, a different read threshold can be selected.

In some embodiments, the change of temperature can be assessed. For example, if temperatures change rapidly, then the model may be established such that an increase number of read threshold calibrations are performed.

In some embodiments, the absolute temperature can affect the model in terms of the read threshold calibration. For example, if the temperature is at 20 degrees Celsius, read threshold calibration can be performed every 4 hours. If the temperature is at −20 degrees Celsius, the read threshold calibration can be performed every 8 hours. In some embodiments, based on the known temperature during the write of the group of memory cells and the predicted temperature for the read of that memory cell, predicted read thresholds can be determined. For example, if the group of memory cells were written at 20 degrees but is predicted to be read at minus 20 degrees, the process 300 can pre-estimate and/or pre-determine the read threshold for this 40 degree range in advance and/or degrees in between.

If the measured environmental parameter is not within a certain threshold of the model, then at block 312, read threshold calibration can be performed, and the read threshold derived from the read threshold calibration can be used. The read threshold calibration can be performed if the environmental parameter is not within a certain threshold of the model, which may be an indication that read thresholds of the model may result in an inaccurate prediction of read thresholds.

Graph Illustrating Read Threshold Adjustment

Figure 4:
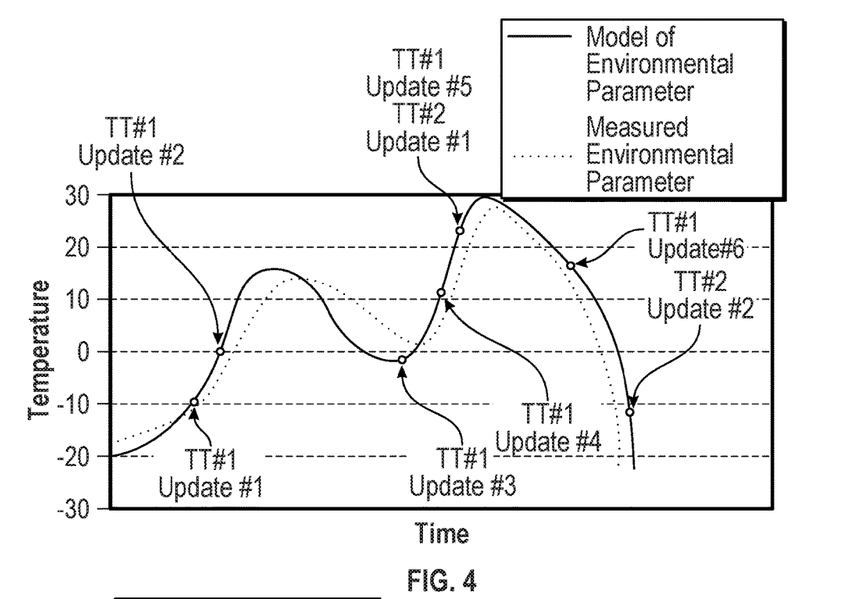
FIG. 4 is a graph illustrating read threshold adjustment according to some embodiments of the present disclosure.

FIG. 4 is a graph illustrating read threshold adjustment according to some embodiments of the present disclosure. The graph illustrates a model of the environmental parameter. For example, the model can include a change in temperature over the course of a time period. The graph also illustrates measurements of the environmental parameter. For example, from time 0 to the time and temperature tag (TT#1), the model expects the temperature to change from −18 degrees to −11 degrees. The measured environmental parameter measures the temperature from −20 degrees to −10 degrees during this time period. Because the measured environmental parameter is within a certain threshold of the model, the read threshold is updated (Update #1).

At the next read threshold determination cycle, the model expects the temperature to change from −10 degrees closer to 0 degrees. The measured environmental parameter is again within a certain threshold of the model, and thus, the read thresholds are updated (Update #2).

A second time and temperature tagging group (TT#2) can be assessed. The read threshold determination cycle for the time temperature taggings can be different. The read threshold determination cycle for a time temperature tagging group of memory cells can be more frequent if the data was written to the memory cells at very high or low temperatures, and/or a long time ago. For example, the read threshold determination cycles for TT #1 occur more often than the read threshold determination cycles for TT #2 because TT #1 was written four years ago at −30 degrees Celsius, where TT #2 was written last week at 0 degrees Celsius. Thus, TT #2 may require less frequent read threshold determination cycles than TT #1. In FIG. 4, TT #2 includes two total updates whereas TT #1 includes 6 total updates to the read thresholds in the same period of time.

In some embodiments, the read threshold cycle can occur based on a period of time that passes, an absolute temperature measurement, a change in temperature, a change in temperature over a period of time, an absolute measurement of an environmental parameter, a change in the environmental parameter, and/or the like. The read threshold cycle can be determined and/or begin based on an operation of the memory device, such as based on a power on/power off, a number of read operations, a number of write operations, and/or the like.

In some embodiments, the read threshold determination cycles can be established to occur more frequently for a larger change in temperature in the model for the environmental parameter. For example, a change of 10 degrees for the model and/or measured environmental parameter over 1 millisecond may trigger a read threshold determination cycle.

In some embodiments, for a large change in temperature in a short period of time in the model and/or the measured environmental parameter, the read thread threshold calibration cycle may be skipped. If the temperature is changing rapidly, it may not make sense to perform read threshold calibration for a read threshold that is only useful for a short period of time (for example, the temperature may continue to change making the read thresholds outdated).

In some embodiments, the model for the environmental parameter can include a power on/power off interval. Based on historical data, the model can predict when the memory device will likely be turned on and/or off. A model of the environmental parameter can include a time period when the memory device is powered off. A model of the environmental parameter can include a time period when the memory device is powered on.

Figure 5:
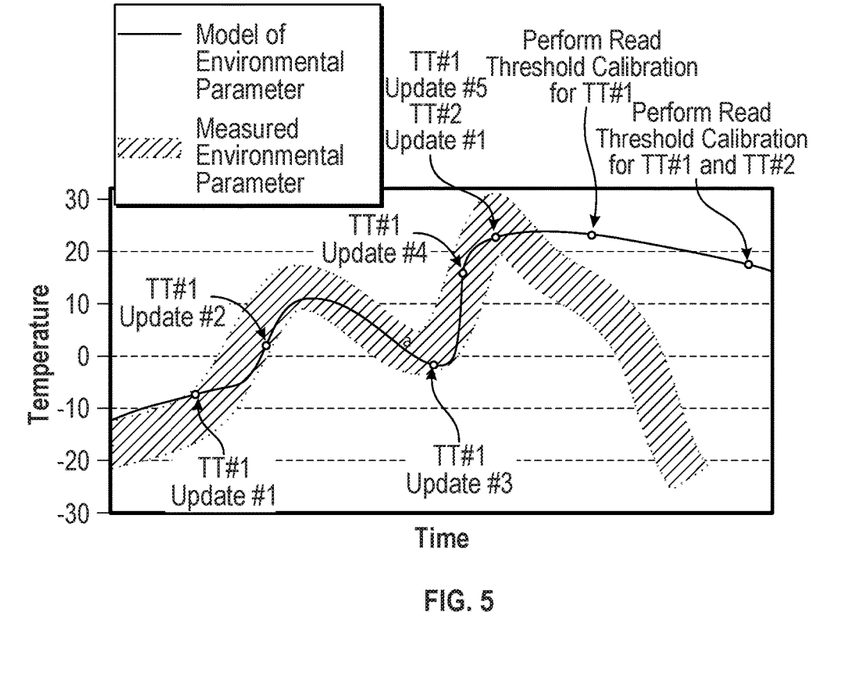
FIG. 5 is a graph illustrating read threshold adjustment according to some embodiments of the present disclosure.

FIG. 5 is a graph illustrating read adjustment according to some embodiments of the present disclosure. The model of the environmental parameter includes a +5/−5 threshold. If the measured environmental parameter is within this threshold, then the predetermined read thresholds can be used. As shown, for the first five read threshold calibration cycles for TT #1, the measured environmental parameter was within the threshold for the model. Accordingly, predetermined read threshold values were used (for example, updates #1-5). But for the sixth and seventh read threshold calibration cycles for TT #1, the measured environmental parameter is outside of the threshold. Thus, a read threshold calibration is performed. Likewise for TT #2, the first read threshold calibration cycle is within the model and thus the predetermined read threshold is used, and the second read threshold calibration cycle is not within the threshold of the model and thus read threshold calibration is performed to determine the read threshold values.

The model can trigger a read threshold calibration and/or receiving the predetermined read threshold based on an amount of time the measured environmental parameter is within or outside the range for the model. For example, a read threshold calibration can be performed when the measured environmental parameter is outside of the threshold for the model over 3 milliseconds.

Although certain embodiments of the present disclosure present examples for read threshold calibration optimization, the embodiments can be applied to other background operations of a memory device. For example, embodiments can be applied to the other background operations of a memory device according to environmental parameter pre-characterization, estimation, prediction, and/or modeling.

Other Variations

Those skilled in the art will appreciate that in some embodiments, additional or alternative modules can be used to perform functionalities described herein. The actual steps taken in the disclosed processes may differ from those shown in the figures. Additional system components can be utilized, and disclosed system components can be combined or omitted. Depending on the embodiment, certain of the steps described above may be removed, others may be added.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to flash memory as included in any number of devices, such as removable flash cards, embedded memory, SSDs, hybrid hard drives, and the like. Moreover, while embodiments are described herein as implemented by a controller of a flash memory device, these functionalities may additionally or alternatively be implemented on systems external to a flash memory device. Illustratively, the machine learning algorithms may be implemented on a network-connected system external to a flash memory device, which operates to collect information from any number of devices and to determine correlations between characteristics of memory cells and offsets to operating parameters of such cells. Such system may then transmit learned correlation information or determined offsets to a flash memory device for use by a controller in the manner described above.

The various components illustrated in the figures may be implemented as software and/or firmware on a processor, ASIC/FPGA, or dedicated hardware. Hardware components, such as processors, ASICs, FPGAs, and the like, can have logic circuitry. Also, the features and attributes of the specific embodiments disclosed above may be combined in different ways to form additional embodiments, all of which fall within the scope of the present disclosure. Although the present disclosure provides certain embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Various disclosed embodiments are applicable to various types of non-volatile solid-state memory which may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (for example, single-level cell (SLC) memory, multi-level cell (MLC) memory, or any combination thereof), NOR memory, EEPROM, Ferroelectric Memory (FeRAM), Magnetoresistive RAM (MRAM), other discrete Non-Volatile Memory (NVM) chips, or any combination thereof.

What is claimed is:

1. A storage device comprising:
   a non-volatile memory comprising a plurality of non-volatile solid-state memory cells; and
   a controller configured to determine a plurality of read thresholds associated with retrieving data stored in the plurality of non-volatile solid-state memory cells, the controller further configured to:
   group at least some of the plurality of solid-state memory cells into a plurality of groups based on one or more values of an environmental parameter at one or more times of storing data in the at least some of the plurality of solid-state memory cells;
   prior to commencement of a future read threshold determination cycle, identify a first forecast of the environmental parameter for the future read threshold determination cycle for a first group of the plurality of groups of solid-state memory cells, wherein the first forecast includes a predicted environmental parameter value at a future time;
   in response to a determination that the first forecast of the environmental parameter satisfies a metric, determine at least one read threshold for the first group without performing read threshold calibration on the first group of the solid-state memory cells;
   in response to a determination that the first forecast of the environmental parameter does not satisfy the metric, determine the at least one read threshold for the first group based on performing read threshold calibration on the first group of the solid-state memory cells; and
   utilize the determined at least one read threshold when reading data stored in at least one solid-state memory cell of the first group.

2. The storage device of claim 1, wherein the controller is further configured to retrieve data stored in at least one solid-state memory cell of the first group based on the determined at least one read threshold.

3. The storage device of claim 1, wherein the determination of the at least one read threshold includes selecting the at least one read threshold from a plurality of precomputed read thresholds.

4. The storage device of claim 1, wherein the environmental parameter comprises ambient temperature.

5. The storage device of claim 4, wherein the first forecast of the environmental parameter comprises a forecast of at least one of an absolute temperature, a temperature difference, or frequency of temperature change.

6. The storage device of claim 1, wherein the controller is further configured to:
   prior to commencement of another future read threshold determination cycle, receive or determine a second forecast of the environmental parameter for the another future read threshold determination cycle for a second group of the plurality of groups of solid-state memory cells;
   determine at least one read threshold for the second group based on a determination whether the second forecast of the environmental parameter satisfies another metric; and
   utilize the determined at least one read threshold when reading data stored in at least one solid-state memory cell of the second group, wherein the at least one read threshold for the second group is different from the at least one read threshold for the first group.

7. The storage device of claim 6, wherein the controller is further configured to determine the at least one read threshold for the first group and determine the at least one read threshold for the second group at different read threshold determination cycles.

8. The storage device of claim 6, wherein the read threshold determination cycles are based on the one or more values of an environmental parameter at the one or more times of storing the data.

9. The storage device of claim 6, wherein the controller is further configured to group the at least some of the plurality of the solid-state memory cells into the plurality of groups based on a time of storing the data into the at least some of the plurality of solid-state memory cells, wherein the read threshold determination cycles are further based on the time.

10. The storage device of claim 1, wherein the controller is configured to identify the first forecast of the environmental parameter by receiving the first forecast of the environmental parameter.

11. The storage device of claim 1, wherein the controller is configured to identify the first forecast of the environmental parameter by determining the first forecast of the environmental parameter.

12. A storage device comprising:
    a non-volatile memory comprising a plurality of non-volatile solid-state memory cells; and
    a controller configured to determine a plurality of read thresholds associated with retrieving data stored in the plurality of non-volatile solid-state memory cells, the controller further configured to:
    group at least some of the plurality of solid-state memory cells into a plurality of groups based on one or more values of an environmental parameter at one or more times of storing data in the at least some of the plurality of solid-state memory cells;
    prior to commencement of a future read threshold determination cycle, identify a forecast of the environmental parameter for the future read threshold determination cycle for a group of the plurality of groups of solid-state memory cells, wherein the forecast includes a predicted environmental parameter value at a future time; and
    selectively perform read threshold calibration on the solid-state memory cells of the group of solid-state memory cells based on the forecast of the environmental parameter to determine at least one read threshold for the group and utilize the determined at least one read threshold when reading data stored in at least one solid-state memory cell of the group.

13. The storage device of claim 12, wherein the controller is further configured to selectively perform read threshold calibration by at least:
    in response to a determination that the forecast of the environmental parameter satisfies a metric, determine at least one read threshold for the group without performing read threshold calibration on the solid-state memory cells of the group; and in response to a determination that the forecast does not satisfy the metric, determine the at least one read threshold for the group based on performing read threshold calibration on the solid-state memory cells of the group.

14. The storage device of claim 12, wherein the controller is further configured to identify the forecast of the environmental parameter by receiving the forecast of the environmental parameter.

15. The storage device of claim 12, wherein the controller is further configured to identify the forecast of the environmental parameter by determining the forecast of the environmental parameter.

16. The storage device of claim 12, wherein the storage device is disposed in at least one of: a vehicle, an airplane, a vessel, a mobile device, a smart home system, an Internet of Things (IoT) device, or a security system.

17. A method of operating a storage device comprising a plurality of non-volatile solid-state memory cells and a controller, the method comprising, by the controller:

grouping at least some of the plurality of solid-state memory cells into a plurality of groups based on one or more values of an environmental parameter at one or more times of storing data in the at least some of the plurality of solid-state memory cells;

prior to commencement of a future read threshold determination cycle, identifying a forecast of the environmental parameter for the future read threshold determination cycle for a group of the plurality of groups of solid-state memory cells, wherein the forecast includes a predicted environmental parameter value at a future time; and selectively performing read threshold calibration on the solid-state memory cells of the group of solid-state memory cells based on the forecast of the environmental parameter to determine at least one read threshold for the group and utilize the determined at least one read threshold when reading data stored in at least one solid-state memory cell of the group.

18. The method of claim 17, wherein the forecast of the environmental parameter comprises a forecast of a bit error rate, and wherein the method further comprises, by the controller, determining the at least one read threshold for the group further based on the forecast bit error rate.

19. The method of claim 18, wherein the method further comprises, by the controller, determining the forecast bit error rate based on a model for the environmental parameter, wherein the model comprises at least one of an ambient temperature or a range for ambient temperature over a predetermined time period.

20. The method of claim 18, wherein selectively performing read threshold calibration is based on a quality of service.

* * * * *